US010134881B1

(12) United States Patent
Tao et al.

(10) Patent No.: US 10,134,881 B1
(45) Date of Patent: Nov. 20, 2018

(54) QUANTUM WELL THERMAL SENSING FOR POWER AMPLIFIER

(71) Applicant: QUALCOMM Incorporated, San Diego, CA (US)

(72) Inventors: Gengming Tao, San Diego, CA (US); Xia Li, San Diego, CA (US); Bin Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/599,157

(22) Filed: May 18, 2017

(51) Int. Cl.
| | | |
|---|---|---|
| *H01L 29/737* | (2006.01) | |
| *G01K 7/01* | (2006.01) | |
| *H01L 29/08* | (2006.01) | |
| *H01L 29/66* | (2006.01) | |
| *H03F 1/30* | (2006.01) | |
| *H03F 3/195* | (2006.01) | |
| *H03F 3/213* | (2006.01) | |
| *H04B 1/40* | (2015.01) | |

(52) U.S. Cl.
CPC ............ *H01L 29/737* (2013.01); *G01K 7/01* (2013.01); *H01L 29/0821* (2013.01); *H01L 29/66318* (2013.01); *H03F 1/302* (2013.01); *H03F 3/195* (2013.01); *H03F 3/213* (2013.01); *G01K 2217/00* (2013.01); *H03F 2200/294* (2013.01); *H03F 2200/451* (2013.01); *H04B 1/40* (2013.01)

(58) Field of Classification Search
CPC ............ H01L 29/66318; H01L 29/737; H01L 29/151; H01L 29/157; H01L 29/158; H01L 29/155; H01L 29/0821; H03F 3/213; H03F 3/195; H03F 1/302; G01K 7/01
See application file for complete search history.

(56) References Cited

U.S. PATENT DOCUMENTS

| | | | |
|---|---|---|---|
| 4,590,507 A | 5/1986 | Capasso et al. | |
| 6,292,089 B1 | 9/2001 | Andersson | |
| 6,335,255 B1 * | 1/2002 | Evaldsson | ........... H01L 21/8252 257/E21.697 |
| 6,410,945 B1 * | 6/2002 | Shiota | ................. H01L 29/0817 257/183 |
| 7,868,335 B1 * | 1/2011 | Li | ......................... H01L 29/155 257/103 |
| 8,803,127 B2 | 8/2014 | Kryskowski | |
| 9,212,389 B2 | 12/2015 | Osri | |
| 9,379,228 B2 * | 6/2016 | Saunders | ............ H01L 29/0891 |
| 2002/0088994 A1 | 7/2002 | Yamaki et al. | |

(Continued)

OTHER PUBLICATIONS

International Search Report and Written Opinion—PCT/US2018/027102—ISA/EPO—Jun. 27, 2018.

(Continued)

*Primary Examiner* — Jarrett Stark
*Assistant Examiner* — Charles N Ausar-El
(74) *Attorney, Agent, or Firm* — Seyfarth Shaw LLP

(57) ABSTRACT

A heterojunction bipolar transistor (HBT) thermal sensing device includes a well structure as a layer between an HBT sub-collector and an HBT substrate. In one instance, the HBT sub-collector contacts an emitter, a collector, and a base of the HBT thermal sensing device. The HBT thermal sensing device also includes a first side electrode in electrical contact with the quantum well structure and a second side electrode in electrical contact with the quantum well structure.

18 Claims, 13 Drawing Sheets

(56) References Cited

U.S. PATENT DOCUMENTS

| | | | |
|---|---|---|---|
| 2006/0163610 A1* | 7/2006 | Sawada | H01L 29/0817 257/197 |
| 2007/0161138 A1 | 7/2007 | Halilov et al. | |
| 2010/0226409 A1* | 9/2010 | Sandhu | G01K 7/22 374/185 |
| 2011/0147713 A1* | 6/2011 | Pillarisetty | H01L 29/4236 257/24 |
| 2011/0227040 A1* | 9/2011 | Iwaki | G01K 7/223 257/14 |
| 2011/0284048 A1 | 11/2011 | Haass et al. | |
| 2012/0139006 A1* | 6/2012 | Zampardi, Jr. | H01L 27/0623 257/192 |
| 2015/0348867 A1* | 12/2015 | Wang | H01L 23/38 361/719 |
| 2016/0005841 A1* | 1/2016 | Obu | H01L 29/41758 257/190 |
| 2016/0351564 A1* | 12/2016 | Azize | H01L 29/66704 |
| 2017/0207125 A1* | 7/2017 | Zampardi, Jr. | H01L 21/8249 |

OTHER PUBLICATIONS

Waldrop J.R., et al., "Determination of Junction Temperature in AlGaAs/GaAs Heterojunction Bipolar Transistors by Electrical Measurement", IEEE Transactions on Electron Devices, May 1, 1992 (May 1, 1992), XP055484764, pp. 1248-1250, DOI: 10.1109/16.129117, Retrieved from the Internet: URL:https://ieeexplore.ieee.org/elx1/16/3604/00129117.pdf?tp=&arnumber=129117&isnumber=3604page1248.

Wurfl J., et al., "Recent Advances in GaAs Devices for Use at High Temperatures", High-Temperature Electronic Materials, Devices and Sensors Conference, Feb. 22-27, 1998, Bahia Hotel, San Diego, California, USA : [Conference Proceedings], IEEE Service Center, Piscataway, NJ, Feb. 22, 1998, pp. 106-116, XP010313531, DOI: 10.1109/HTEMDS.1998.730659, ISBN: 978-0-7803-4437-2.

* cited by examiner

US 10,134,881 B1

QUANTUM WELL THERMAL SENSING FOR POWER AMPLIFIER

BACKGROUND

Field

The present disclosure relates generally to wireless communication systems, and more specifically, to thermal sensing for a heterojunction bipolar transistor-based power amplifier (PA).

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation.

The implementation of carrier aggregation in mobile RF transceivers enables a wireless carrier to increase available bandwidth by simultaneously using multiple frequencies for a single communication stream. While an increased amount of data is provided to the end user, successful implementation of carrier aggregation complicates thermal power specifications of power amplifiers in the mobile RF transceiver. These thermal power specifications are further complicated because RF power amplifiers are generally not fabricated using a CMOS (complementary metal-oxide-semiconductor) process. Because compound semiconductor materials (e.g., column III and column V (III-V) or column II and column IV (II-VI)) generally exhibit poor thermal conduction capabilities, it is difficult to meet thermal power specifications in compound semiconductor devices (e.g., III-V or II-VI), such as heterojunction bipolar transistor (HBT)-based power amplifiers.

SUMMARY

A heterojunction bipolar transistor (HBT) thermal sensing device includes an HBT substrate and an HBT active device, which includes a sub-collector contacting an emitter, a collector, and a base. The HBT thermal sensing device may also include a quantum well structure between the HBT active device and the HBT substrate. The HBT thermal sensing device may further include a first side electrode in electrical contact with the quantum well structure and a second side electrode in electrical contact with the quantum well structure.

A method of making a heterojunction bipolar transistor (HBT) thermal sensing device includes forming an HBT active device. The method also includes forming a quantum well structure on a substrate of the HBT active device. The method may further include forming a first electrode in electrical contact with the quantum well structure and forming a second electrode in electrical contact with the quantum well structure.

A heterojunction bipolar transistor (HBT) thermal sensing device includes an HBT substrate and an HBT active device, which includes a sub-collector contacting an emitter, a collector, and a base. The HBT thermal sensing device may also include a quantum well structure between the HBT active device and the HBT substrate. The HBT thermal sensing device may further include first means for electrically contacting the quantum well structure and second means for electrically contacting the quantum well structure.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
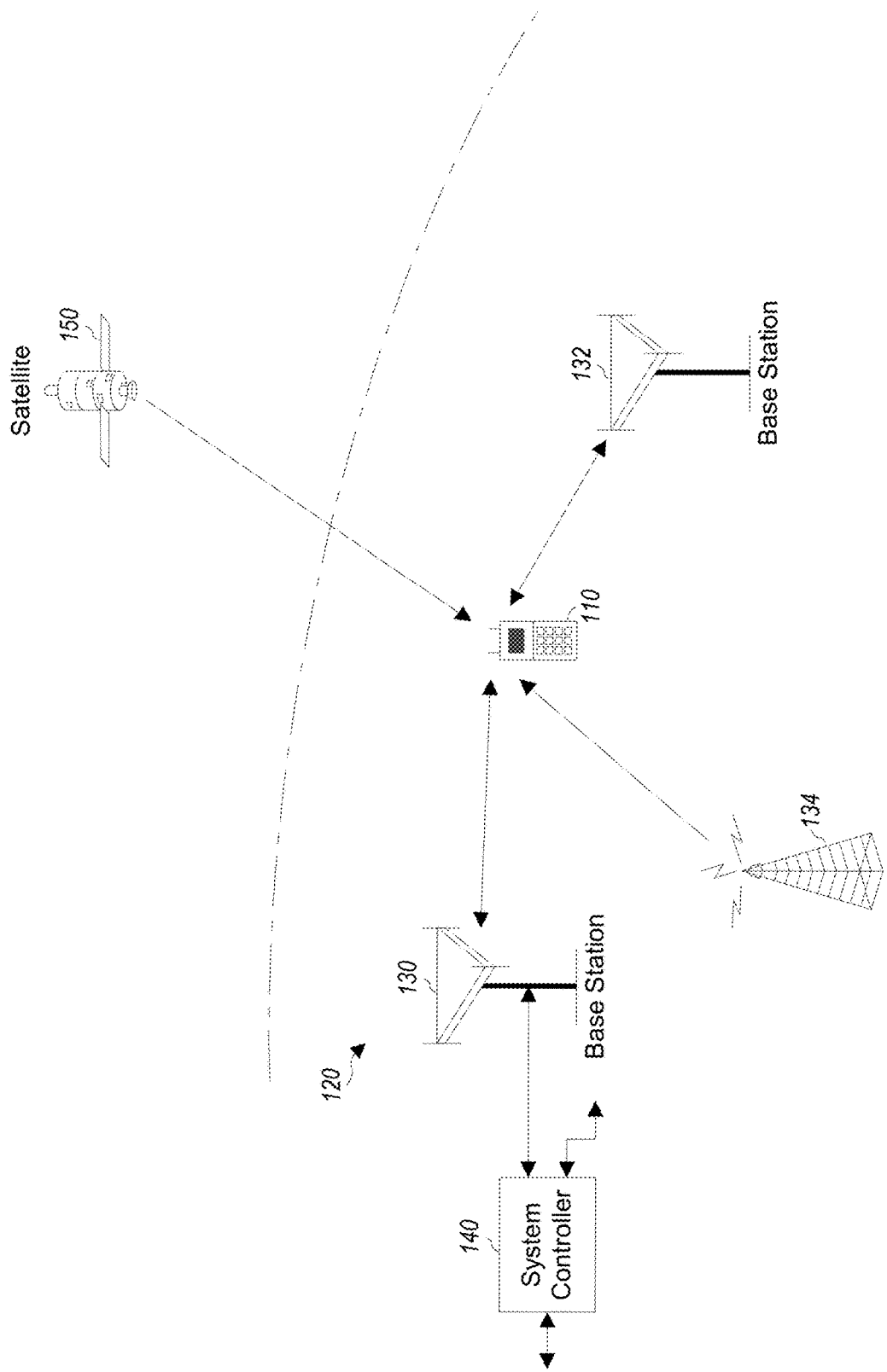
FIG. 1 shows a wireless device communicating with a wireless system, according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Fabrication of mobile radio frequency (RF) chip designs (e.g., mobile RF transceivers) becomes complex at deep sub-micron process nodes due to cost and power consumption considerations. Further design challenges for mobile RF transceivers include analog/RF performance considerations, including mismatch, noise, and other performance considerations. The design complexity of these mobile RF transceivers is further complicated by added circuit functions to support communication enhancements, such as carrier aggregation. The implementation of carrier aggregation in mobile RF transceivers enables a wireless carrier to increase available bandwidth by simultaneously using multiple frequencies for a single communication stream.

While an increased amount of data is provided to the end user, successful implementation of carrier aggregation complicates thermal specifications of power amplifiers in a mobile RF transceiver. For example, in a mobile RF transceiver, a communication signal is amplified and transmitted by a transmit section. The transmit section may include one or more circuits that amplify and transmit the communication signal. The amplifier circuits may include one or more amplifier stages that may have one or more driver stages and one or more power amplifier stages. Each of the amplifier stages may include one or more transistors configured in various ways to amplify the communication signal. The transistors configured to amplify the communication signal, however, are generally selected to operate at substantially higher frequencies, further complicating thermal power specifications.

These thermal power specifications are further complicated because RF power amplifiers are generally not fabricated using a CMOS (complementary metal-oxide-semiconductor) process. Because column III and column V (III-V) or column II and column IV (II-VI) compound semiconductor materials generally exhibit poor thermal conduction capabilities, it is difficult to meet thermal power specifications in III-V or II-VI compound semiconductor devices, such as heterojunction bipolar transistor (HBT)-based power amplifiers.

Bipolar transistors, which are also referred to as bipolar junction transistors (BJTs), are a type of transistor that uses charge carriers including both hole charge and electron carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitters and base regions of the device, which create a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

A heterojunction bipolar transistor (HBT) integrated circuit (HBT chip) may include an HBT to provide a power amplifier. Unfortunately, power amplifiers (e.g., 3G/4G HBT power amplifiers) in mobile phones may suffer from thermal issues. In particular, a significant challenge in designing HBT-based power amplifiers is thermal stability, which may reduce a safe operating area size. As a result, heat dissipation is increasingly problematic for HBT-based power amplifiers. In fact, the compound semiconductor materials used by HBT-based power amplifiers may lead to localized thermal hot spots. As the localized thermal hot spots are embedded in the device, this may reduce the ability to cool the hot spots and achieve low junction temperatures. Conventional cooling solutions for achieving low junction temperatures include heatsinks, heat spreaders, and/or improved printed circuit boards. Conventional techniques of simply increasing the size of the heat spreader and/or the heatsink are impractical in small form factor devices (e.g., smartphones).

This thermal instability may be due to severe heat generated inside an HBT collector, for example, under an emitter/base region of an HBT-based power amplifier. Furthermore, compound semiconductor materials (e.g., gallium arsenide (GaAs)) used to fabricate HBT-based power amplifiers are poor thermal conductors relative to non-compound semiconductor materials (e.g., four times worse than silicon (Si))—because heat cannot easily spread from the substrate. Moreover, HBT emitter/base materials (e.g., indium GaAs (InGaAs)/indium gallium phosphide (InGaP)) exhibit poor thermal conductivity relative to GaAs (e.g., eight times worse).

An HBT-based power amplifier that combines compound semiconductor materials (e.g., a GaAs substrate supporting InGaAs/InGaP emitter/base materials) incurs a further reduction in thermal conductivity (e.g., thirty times worse). Together, these compound semiconductor materials lead to increased heat that cannot easily spread through a top portion of the HBT emitter. These thermal issues are further exacerbated by future 5G and 5G+ power amplifiers due to higher operating frequencies, which translates into higher dynamic power that generates heat. There is no effective heatsink in current HBT structures to handle thermal issues for 5G HBTs.

Furthermore, HBT power stages may exhibit a non-uniform temperature profile, which may be difficult to detect if a sensing device is separated from the power stages. As a result, sensing of an HBT junction temperature may be inaccurate. These thermal issues negatively affect the performance of HBT-based power amplifiers.

Aspects of the present disclosure may solve this problem by a well structure (e.g., a quantum well, superlattice structure, or the like) as a layer between an HBT sub-collector and an HBT substrate. In one configuration, an isolation layer is provided between the HBT sub-collector and the well structure. In this aspect of the disclosure, a hot side electrode is in electrical contact with the well structure and aligned with an HBT emitter. A hot electrode may be used to monitor junction temperature for controlling an HBT bias to improve performance of an HBT-based power amplifier. The hot electrode may be a backside electrode through the substrate to the well structure. A cold side electrode may also be provided as a backside electrode through the substrate to the well structure.

FIG. 1 shows a wireless device 110 communicating with a wireless communication system 120. The wireless communication system 120 may be a 5G system, long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2A:
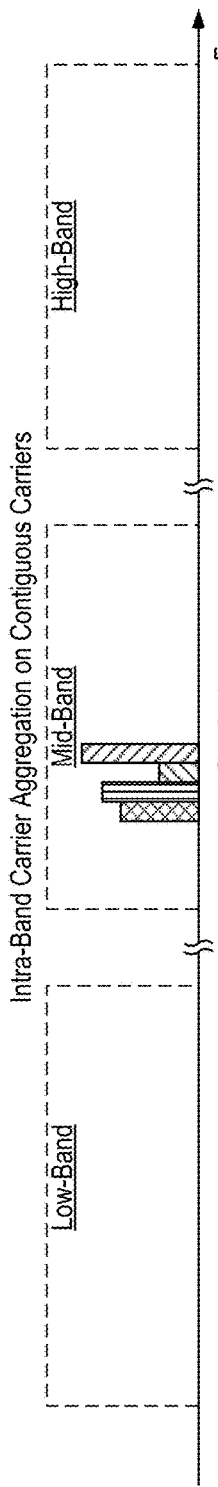
FIGS. 2A-2D show four examples of carrier aggregation (CA), according to aspects of the present disclosure.

FIG. 2A shows an example of contiguous intra-band CA. In the example shown in FIG. 2A, a wireless device (e.g., the wireless device 110) is configured with four contiguous carriers in the same band, which is a band in mid-band. The wireless device may send and/or receive transmissions on multiple contiguous carriers within the same band.

Figure 2B:
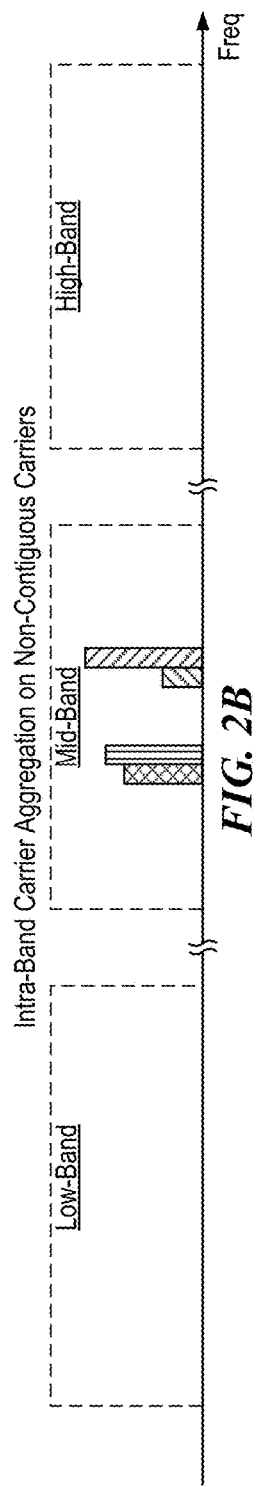

FIG. 2B shows an example of non-contiguous intra-band CA. In the example shown in FIG. 2B, a wireless device (e.g., the wireless device 110) is configured with four non-contiguous carriers in the same band, which is a band in mid-band. The carriers may be separated by 5 MHz, 10 MHz, or some other amount. The wireless device may send and/or receive transmissions on multiple non-contiguous carriers within the same band.

Figure 2C:
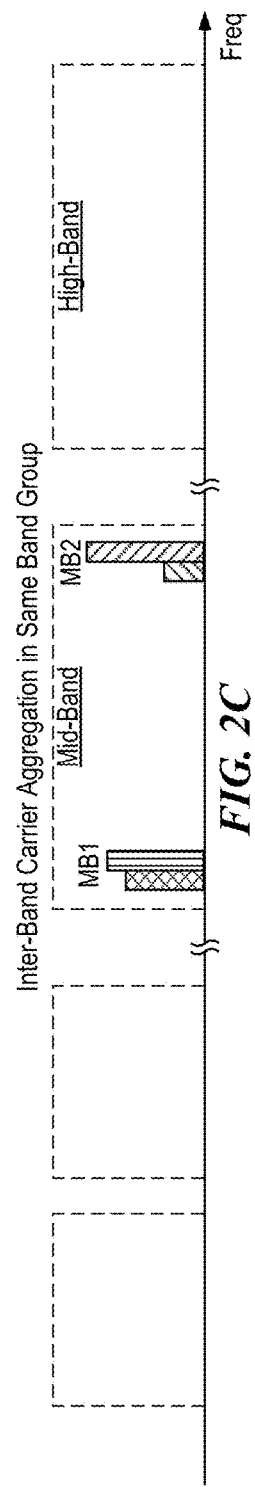

FIG. 2C shows an example of inter-band CA in the same band group. In the example shown in FIG. 2C, a wireless device (e.g., the wireless device 110) is configured with four carriers in two bands in the same band group, which is mid-band. The wireless device may send and/or receive transmissions on multiple carriers in different bands in the same band group (e.g., Mid-Band 1 (MB1) and Mid-Band 2 (MB2) in FIG. 2C).

Figure 2D:
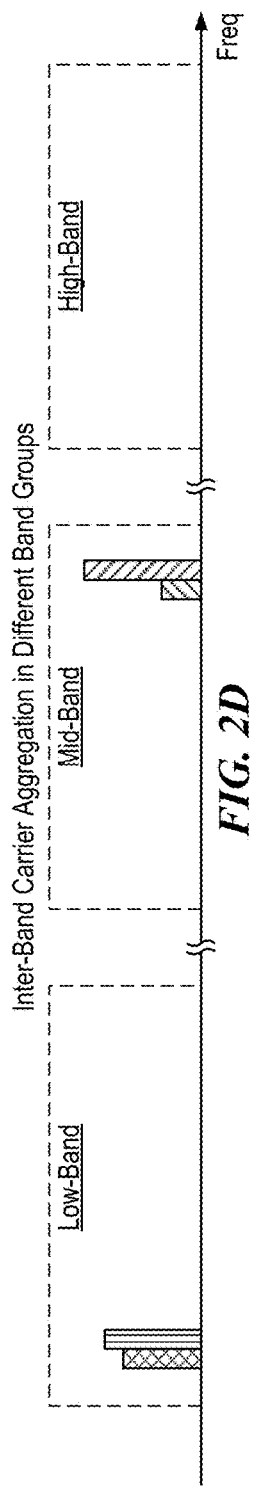

FIG. 2D shows an example of inter-band CA in different band groups. In the example shown in FIG. 2D, a wireless device (e.g., the wireless device 110) is configured with four carriers in two bands in different band groups, which include two carriers in one band in low-band and two additional carriers in another band in mid-band. The wireless device may send and/or receive transmissions on multiple carriers in different bands in different band groups (e.g., low-band and mid-band in FIG. 2D). FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long-term evolution in unlicensed spectrum (LTE-U).

Figure 3:
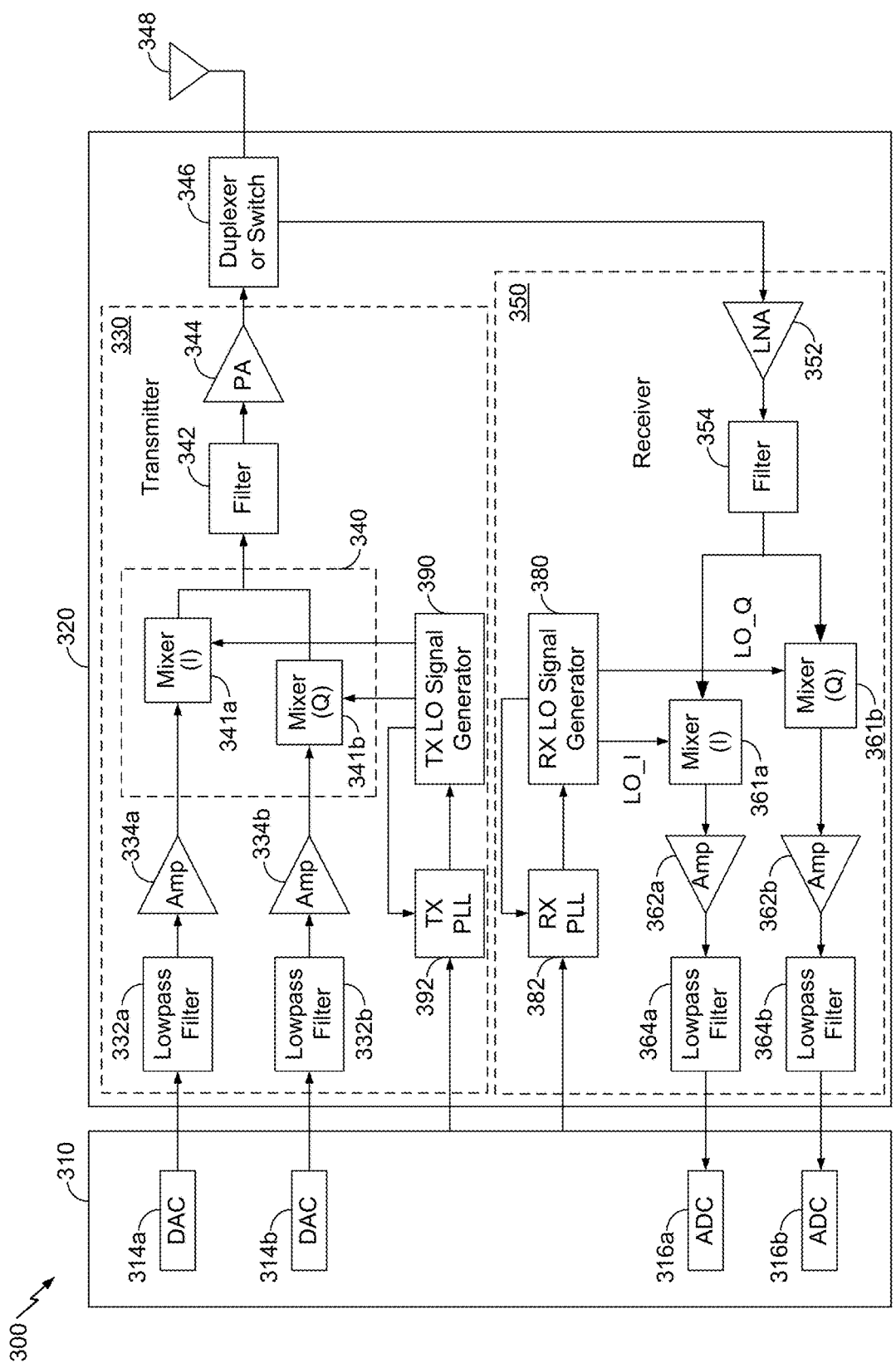
FIG. 3 shows a block diagram of the wireless device in FIG. 1, according to an aspect of the present disclosure.

FIG. 3 shows a block diagram of an exemplary design of a wireless device 300, such as the wireless device 110 shown in FIG. 1. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. An upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. The transistors configured to amplify the communication signal, however, are generally selected to operate at substantially higher frequencies, further complicating thermal power specifications. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

Figure 4:
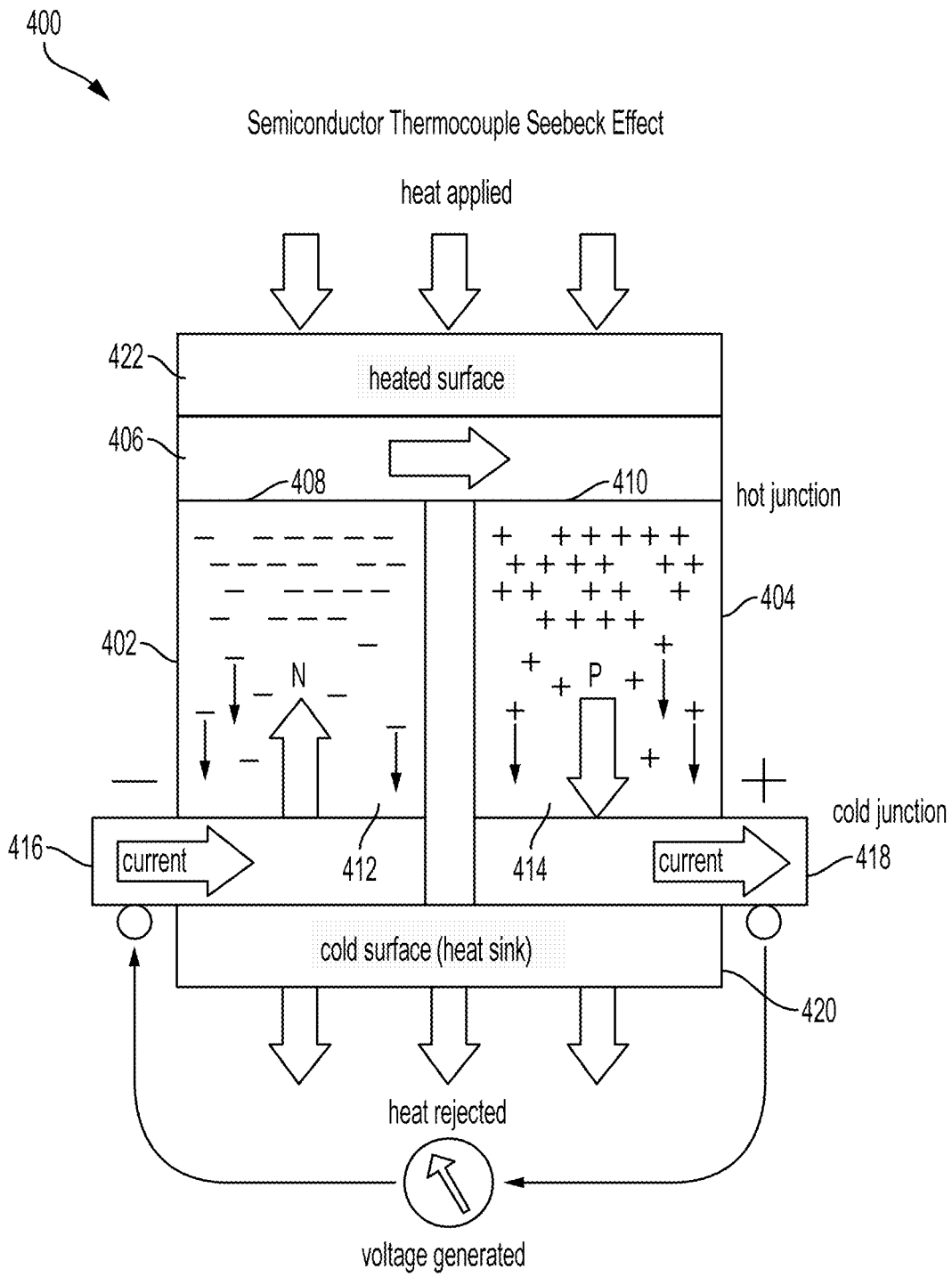
FIG. 4 is an example of a schematic illustration of semiconductor thermocouple Seebeck effect.

FIG. 4 is an example of a schematic illustration of semiconductor thermocouple Seebeck effect. The Seebeck effect is the conversion of heat directly into electricity at a junction of different thermoelectric materials. Thermoelectric materials are a class of materials that convert temperature differences into electricity and vice versa. Such materials utilize the Seebeck effect for power generation. A temperature gradient across a thermoelectric material causes the diffusion of charged carriers across that gradient, thus creating a voltage difference between hot and cold ends of the material. Therefore, thermoelectric materials can act as electric power generators in the presence of a temperature difference.

FIG. 4 shows a structure 400 of a Seebeck element. The structure includes a first conductive member (e.g., a n-type semiconductor) 402 and a second conductive member (e.g., a p-type semiconductor) 404. The second conductive member 404 has a Seebeck coefficient different from a Seebeck coefficient of the first conductive member 402.

A first surface 408 of the first conductive member 402 and a first surface 410 of the second conductive member 404 are joined to a first joining member 406 (e.g., by ohmic contact). The first joining member 406 is heated to a temperature T1 via a heated surface 422 (e.g., thermally conducting material), and constitutes a high temperature part. A second surface 412 of the first conductive member 402 is joined to a second joining member 416 (e.g., by ohmic contact), and a second surface 414 of the second conductive member 404 is joined to a third joining member 418 (e.g., by ohmic contact). The second joining member 416 and the third joining member 418 are set to a temperature T2, and constitute a low temperature part, such that T1>T2. A cooling surface (e.g., heatsink) 420 may be coupled to the second joining member 416 and the third joining member 418.

When the two surfaces of the first conductive member 402 and the second conductive member 404 have different temperatures (T1 and T2), an electric potential is achieved. For example, when the first joining member 406 is held to the high temperature (T1) and the second joining member 416 and the third joining member 418 are held to the low temperature (for example, room temperature T2), a voltage (e.g., thermal electromotive force) proportional to a temperature difference between the first joining member 406, the second joining member 416, and the third joining member 418 is generated in accordance with the Seebeck effect.

Seebeck effect efficiency of a thermoelectric material is characterized as a figure of merit (ZT) according to the following equation:

$$ZT = \frac{S^2 \sigma}{\kappa} T \qquad \text{equation 1}$$

where S is a Seebeck coefficient or thermal power;
σ is an electric conductivity;
k is a thermal conductivity; and
T is an absolute temperature.

From equation 1, it is observed that an increased (or large) Seebeck coefficient and electric conductivity with a corresponding decreased (or small) thermal conductivity results in an increased (or high) figure of merit (ZT).

Thermal-electric efficiency (e.g., Seebeck effect efficiency) of some semiconductor structures (e.g., quantum well) exhibits thermal and electrical characteristics that are advantageous relative to others (e.g., bulk semiconductor structures). An example of a semiconductor structure is illustrated in FIG. 5.

Figure 5:
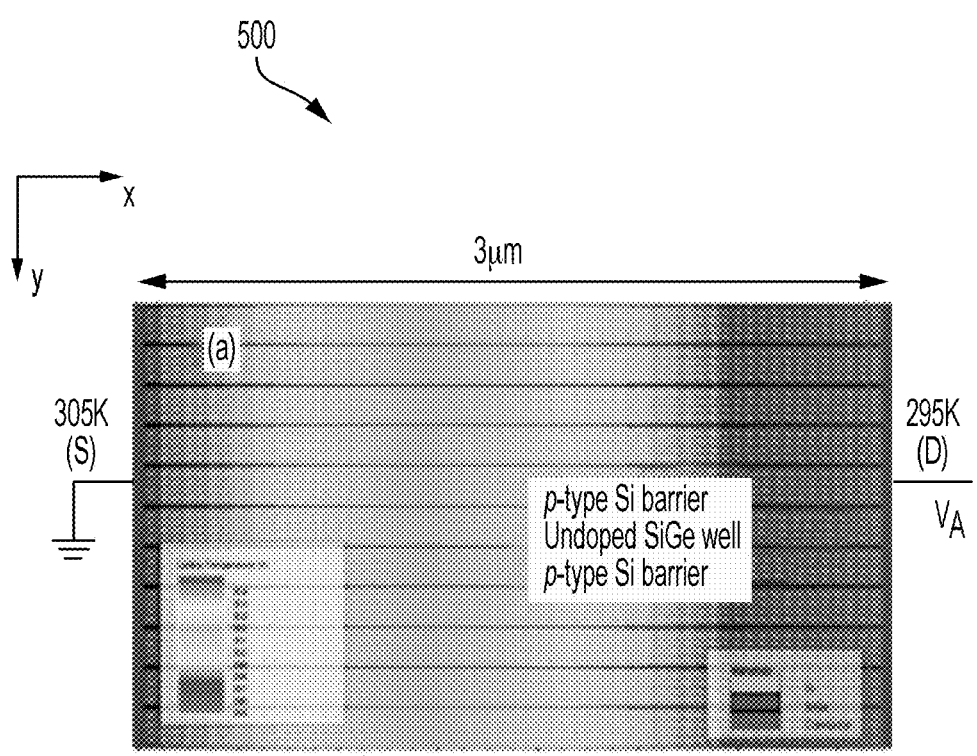
FIG. 5 illustrates an example of a p-type quantum well structure for heat dissipation.

FIG. 5 illustrates an example of a p-type quantum well structure 500 for heat dissipation. The quantum well structure 500 may include a silicon germanium/silicon (SiGe/Si) quantum lattice. The SiGe/Si quantum lattice may include p-type Si barriers and undoped SiGe wells alternatively layered throughout the quantum well structure 500. For example, one layer of the quantum lattice includes the p-type Si barrier followed by another layer that includes undoped SiGe and so on. In some implementations, the number of layers may be twelve to twenty.

Thermal-electric efficiency of the SiGe/Si quantum well structure 500 is advantageous over bulk semiconductor structures. The advantage may be due to carrier confinement in the SiGe/Si quantum well structure 500 which increases local density of states per unit volume near Fermi energy. Fermi energy is a concept in quantum mechanics usually referring to an energy difference between highest and lowest occupied single-particle states in a quantum system of non-interacting fermions at absolute zero temperature. The confinement of carriers (e.g., electrons and holes) improve carrier density and mobility, and decrease thermal conductivity. The advantage may also be due to decreased thermal conductivity due to phonon confinement and phonon scattering at quantum well interfaces. The SiGe/Si quantum well structure, however, is subject to strain that degrades power dissipation.

Some devices (e.g., power amplifiers) have complicated thermal power specifications that are difficult to meet. The thermal power specifications may be based on the semiconductor structure implementation of the devices. Some power amplifiers may be implemented with bipolar transistors (e.g., heterojunction bipolar transistor (HBT)), as illustrated in FIG. 6.

Figure 6:
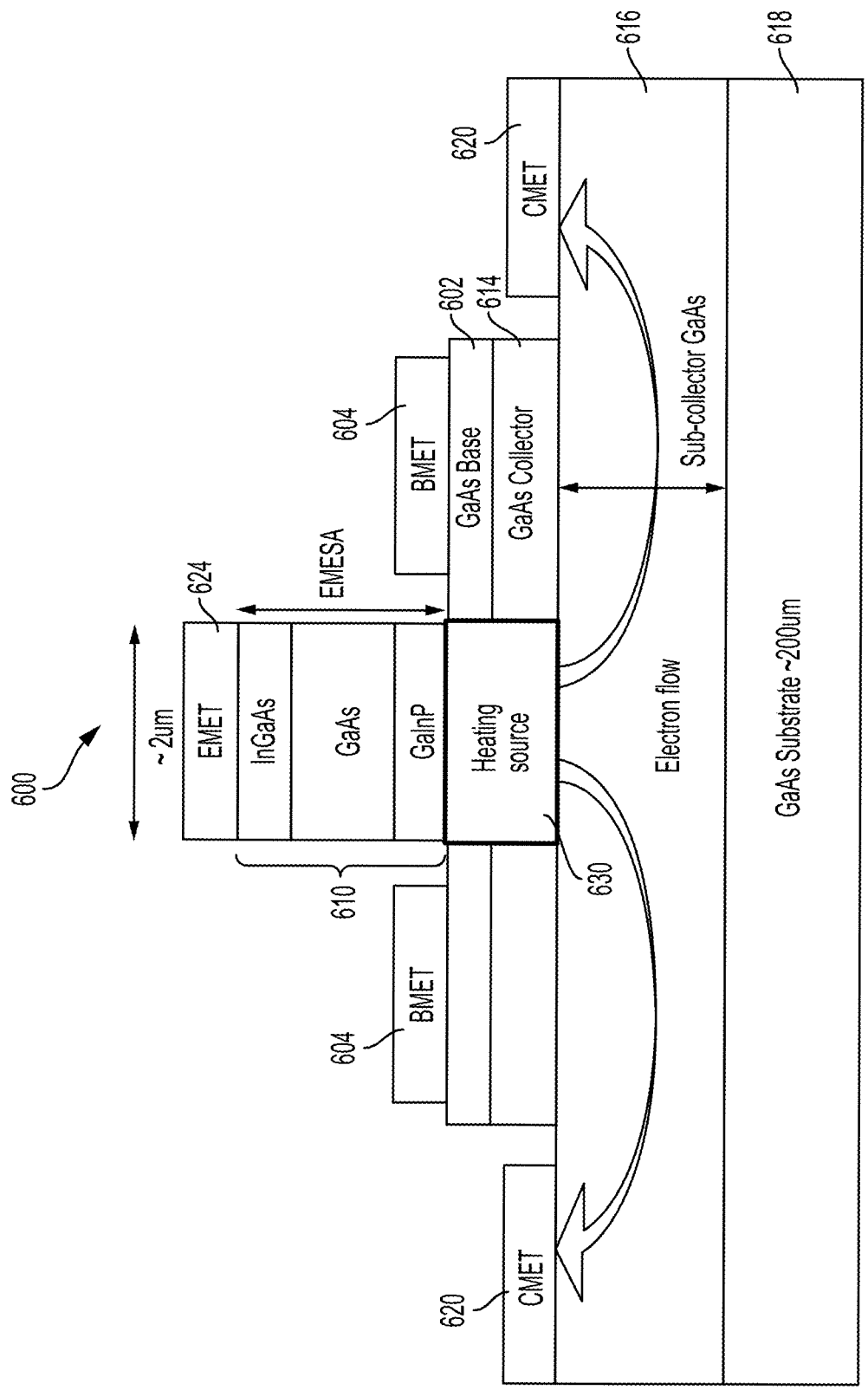
FIG. 6 illustrates an example of a heterojunction bipolar transistor (HBT) device.

FIG. 6 illustrates an example of a heterojunction bipolar transistor (HBT) device 600. The HBT device 600 may include an emitter 610, a base 602 contacting the emitter 610, a collector 614 contacting the base 602, and a sub-collector 616 contacting the collector 614. The emitter 610 includes an emitter contact 624, the base includes base contacts 604, and the collector includes collector contacts 620. The sub-collector 616 may be supported by a compound semiconductor substrate 618. In some implementations, a thickness of the emitter 610 is two-hundred (200) nanometers (nm), and a thickness of the base 602 is less than one hundred nanometers (100 nm). In addition, a thickness of the collector 614 is one-thousand five hundred nanometers (1500 nm), and a thickness of the sub-collector 616 is six-hundred nanometers (600 nm). A width of the emitter 610 is two micrometers while a thickness of the substrate is two hundred micrometers. These values are exemplary only, and other values are possible.

The emitter 610 may be composed of indium gallium arsenide (InGaAs), gallium arsenide (InGaAs), and/or gallium indium phosphide (GaInP). The base 602, the collector 614, and the sub-collector 616 may each be composed of gallium arsenide (GaAs). These materials are exemplary only, and other materials may be used.

According to an aspect of the present disclosure, the sub-collector 616 may be composed of a III-V compound semiconductor material or a II-VI compound semiconductor material. These compound semiconductor materials may include, but are not limited to, gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide: nitride (InGaAs:N). These are exemplary only, and other materials are possible.

As noted, because the HBT device 600 combines compound semiconductor materials (e.g., a GaAs collector supporting InGaAs/InGaP emitter/base materials), thermal conductivity of the HBT device 600 is extremely poor. As a result, heat from a heat source 630 is trapped within the collector 614 and the base 602 of the HBT device 600. Without some way for dissipating, the heat from a heat source 630, of the HBT device 600 may be damaged and may eventually fail. To mitigate the heat dissipation some implementations use a thermal sensing device integrated into a power amplifier, as illustrated in FIG. 7.

Figure 7:
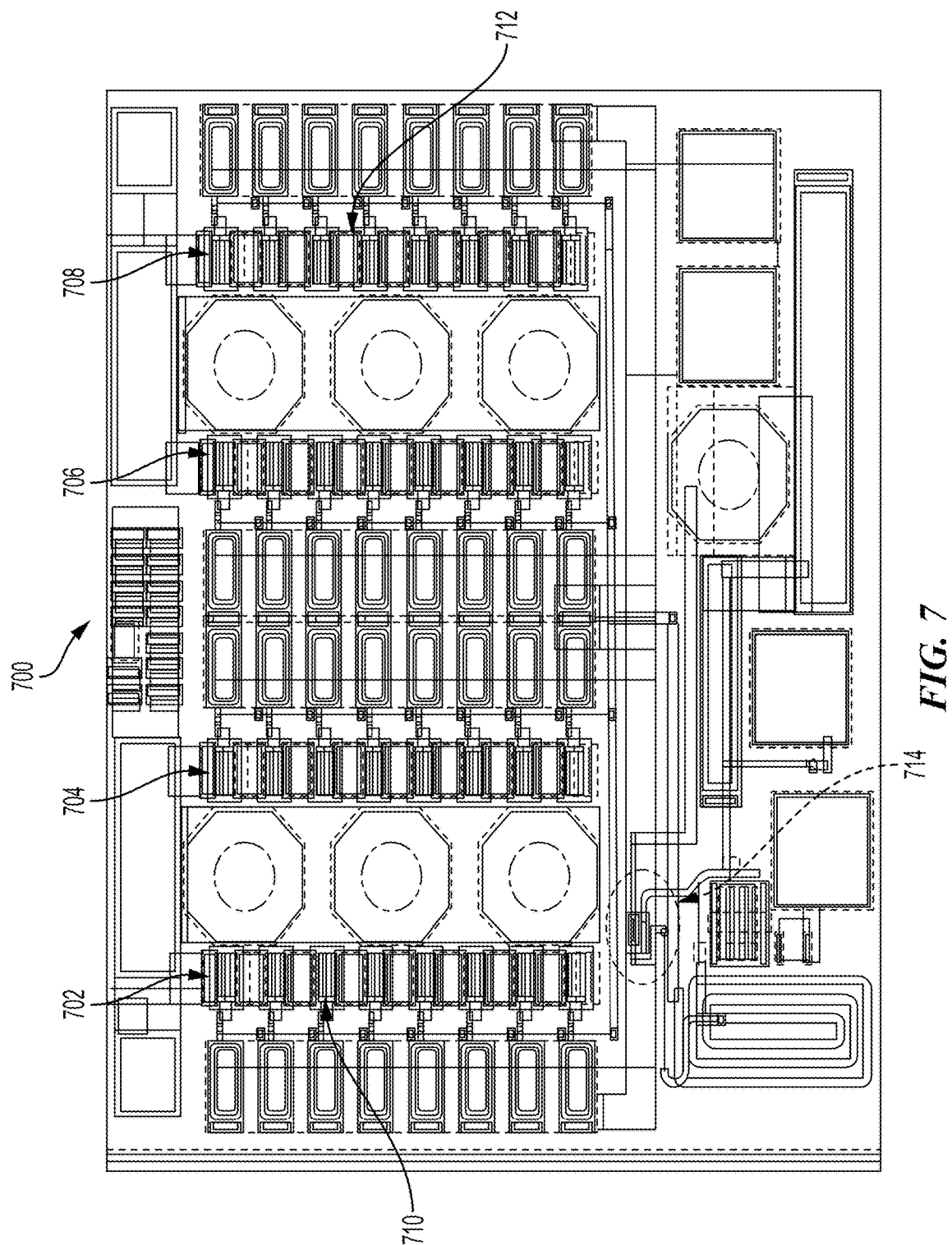
FIG. 7 illustrates a heterojunction bipolar transistor (HBT) power amplifier for mitigating power or heat dissipation.

FIG. 7 illustrates an HBT power amplifier 700 for mitigating power dissipation. The HBT power amplifier 700 may include a first row 702 of HBT devices 710, a second row 704 of HBT devices 710, a third row 706 of HBT devices 710, a fourth row 708 of HBT devices 710, and a thermal sensing device 714. The thermal sensing device 714 may include an HBT device. Each row of the HBT power amplifier 700 includes eight HBT devices 710. The thermal sensing device may be positioned close to a row of the HBT devices that may get the hottest. Thermal sensing (e.g., with the thermal sensing device 714) may be based on a relationship between performance of a device and temperature where the performance of the device degrades with increased temperature. For example, the electrical performance of the thermal sensing device 714 may be monitored when the thermal sensing device 714 is subject to heat from the HBT devices 710. Some parameters of the HBT power amplifier 700 may be adjusted based on the monitoring of the thermal sensing device 714 to mitigate power dissipation.

In normal operation, a junction temperature of each of the HBT devices 710 inside the HBT power amplifier 700 can be as high as 200° C. Of course, the higher junction temperature is not preferred because it may cause the device to burn or degrade a reliability of the device. The thermal sensing device 714 may be included in the HBT power amplifier 700 to mitigate power dissipation. A single or limited number of thermal sensing devices 714 are used in an HBT power amplifier 700 because of space constraints. The limited number of thermal sensing devices 714 placed in the HBT power amplifier 700 is insufficient to accurately capture heat dissipation within the HBT power amplifier 700. For example, a limited number of thermal sensing devices 714 are not enough to capture multiple hot spot locations, which results in measuring inaccuracies.

Moreover, conventional thermal sensing devices 714 are on a same chip level as the HBT devices 710 and cannot accurately sense junction temperatures directly below the HBT devices 710. For example, while the conventional thermal sensing device 714 may sense heat (e.g., 630) on the same chip level, heat that is further below the chip level may not be accurately captured by the conventional thermal sensing device 714. Moreover, the thermal sensing device 714 may be located more than twenty or thirty micrometers away from the HBT devices 710 and therefore the thermal sensing device 714 cannot sense every HBT device 710. Some HBT devices are located even further (e.g., over two hundred or three hundred micrometers) from the thermal sensing device 714.

Although the HBT power amplifier 700 includes other circuitry and control, the hottest areas of the HBT power amplifier 700 are the power output stages, which include the HBT devices 710. Another issue with power dissipation of the HBT power amplifier 700 is that each row of HBT devices 710 operates differently. The multiple hot spot locations of the HBT power amplifier 700 are illustrated in FIG. 8.

Figure 8:
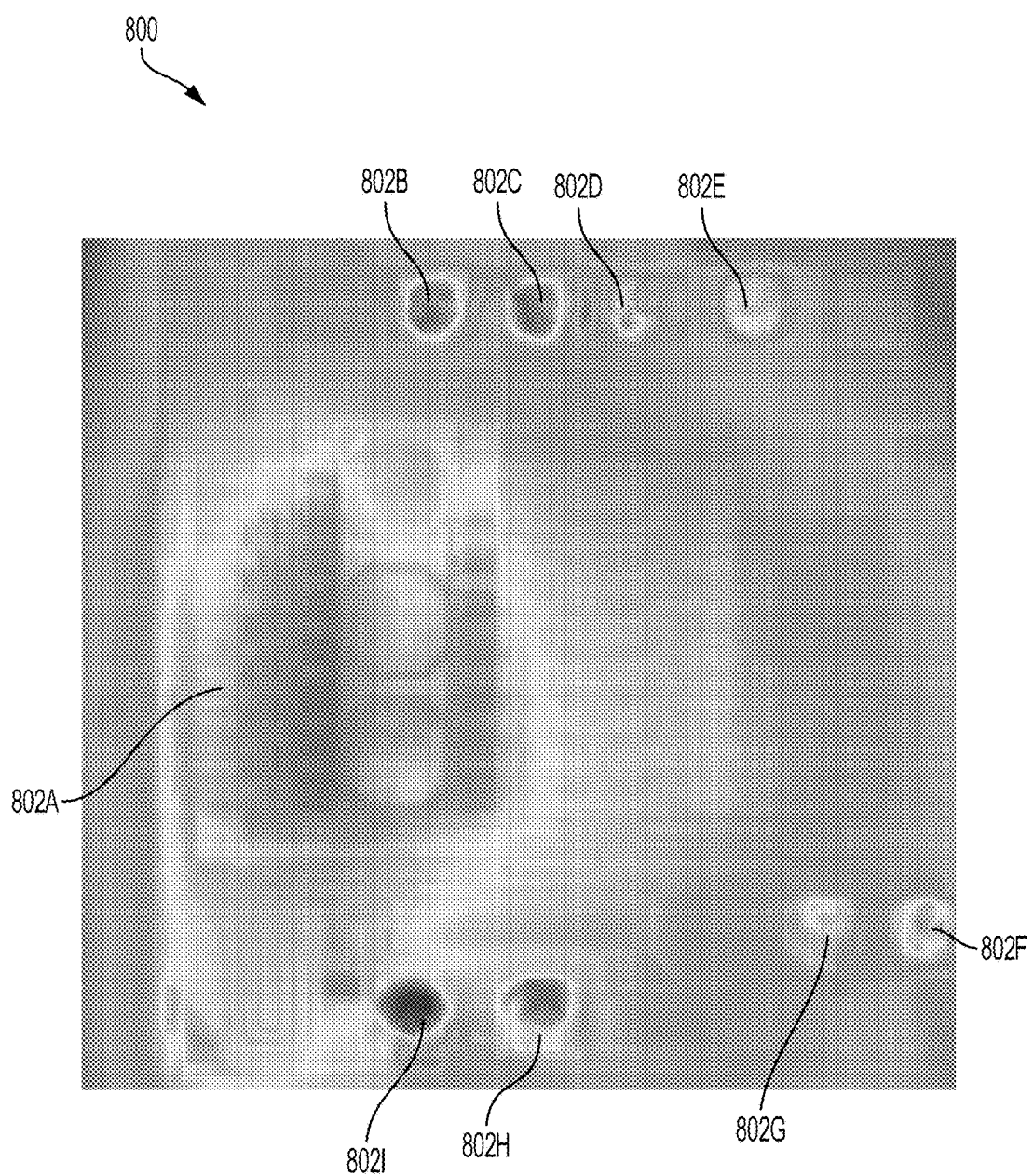
FIG. 8 illustrates an example thermal image of a temperature profile of the HBT power amplifier of FIG. 7.

FIG. 8 illustrates an example thermal image 800 of a temperature profile of the HBT power amplifier 700 of FIG. 7. Mitigating power dissipation is dependent on shifting and moving hot spots 802 during operation of the HBT power amplifier 700. Taking a thermal image (e.g., infrared image) for the four rows of HBT devices 710, the first row 702 is the hottest followed by the second row 704. This non-uniformity presents an issue for power dissipation including an issue associated with placement of the thermal sensing devices 714. While a majority of the hotspots in this thermal image 800 are located in the region 802A, the hotspots are shifting (in terms of locations in the HBT power amplifier 700) and are spread throughout the HBT power amplifier 700. Placing thermal sensing devices 714 over any possible hotspot is challenging or impossible.

Unfortunately, a significant challenge in designing HBT-based power amplifiers is thermal stability, which may reduce a safe operating area size. Heat dissipation is increasingly problematic in HBT-based power amplifiers. In particular, the compound semiconductor materials used by HBT-based power amplifiers may lead to localized thermal hot spots. As the localized thermal hot spots are embedded in the device, this may reduce the ability to cool the hot spots and achieve low junction temperatures.

Figure 9A:
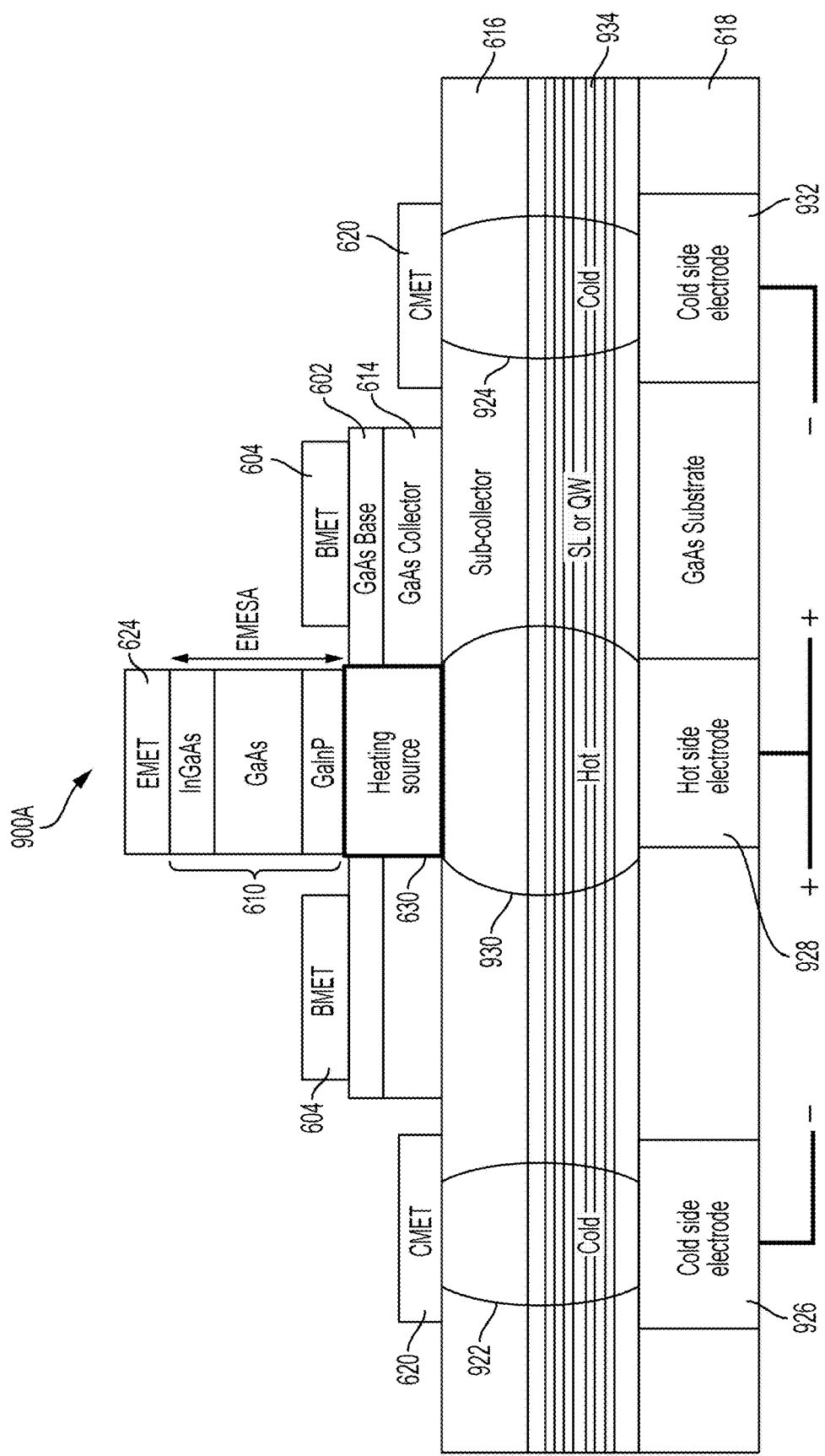
FIG. 9A illustrates a heterojunction bipolar transistor (HBT) thermal sensing device for power dissipation according to aspects of the present disclosure.
Figure 9B:
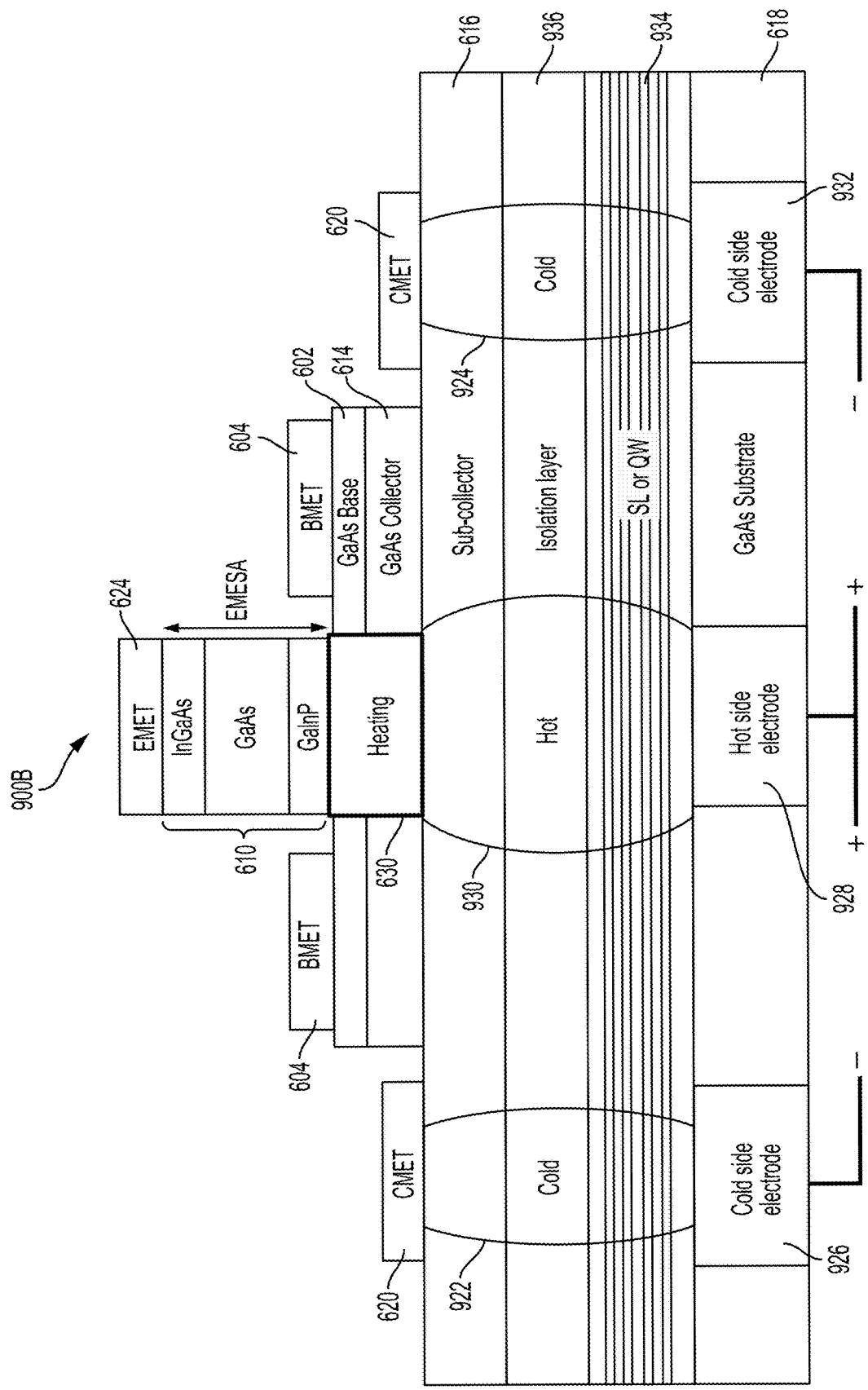
FIG. 9B illustrates another heterojunction bipolar transistor (HBT) thermal sensing device for power dissipation according to aspects of the present disclosure.

Aspects of the present disclosure may solve this problem by incorporating a well structure (e.g., a quantum well, superlattice, or the like) as a layer between an HBT sub-collector and an HBT substrate, as illustrated in FIGS. 9A and 9B.

FIG. 9A illustrates a heterojunction bipolar transistor (HBT) thermal sensing device 900A for power dissipation according to aspects of the present disclosure. For illustrative purposes, some of the labelling and numbering of the devices and features of FIG. 9A are similar to those of FIGS. 6 and 7. For example, similar to the HBT device 600, the HBT thermal sensing device 900A may include an HBT active device, which includes the emitter 610, the base 602 contacting the emitter 610, and the collector 614 contacting the base 602. The HBT thermal sensing device 900A may also include the sub-collector 616 contacting the collector 614. The sub-collector 616 supports the emitter 610, the collector 614, and the base 602.

FIG. 9A further includes a well structure 934 (e.g., quantum well or super lattice) that is supported by the compound semiconductor substrate 618. For example, the substrate may be a GaAs substrate that has a thickness of seventy five micrometers. The well structure 934 may be lattice matched with the substrate 618, that is, having a same dielectric constant. The well structure 934 may be formed as a layer/layers between the HBT active device and the sub-collector 616 or the substrate 618. For example, the quantum well 934 may be formed across the whole wafer on the compound semiconductor substrate 618 and the active device is fabricated on the quantum well 934. The well structure 934 may be a p-type well structure or a n-type well structure. A proximity of the well structure 934 to the sub-collector 616 may be based on a specified device performance.

In one aspect, the quantum well 934 may be composed of a material that is compatible or matched with materials of the HBT device 600. For example, the sub-collector 616 may be composed of a III-V compound semiconductor material and the quantum well 934 may also be composed of a III-V compound semiconductor material. Further, the well structure 934 (e.g., AlGaAs/GaAs or InGaP/GaAs) and the compound semiconductor substrate 618 may be composed of substantially the same material (e.g., GaAs). The well structure 934 includes two materials, namely, a large bandgap compound semiconductor material and a small bandgap compound semiconductor material. For example, AlGaAs and InGaP are large bandgap compound semiconductor materials while GaAs is a small bandgap compound semiconductor material.

Matching the material of the quantum well structure with the material of the HBT device 600 reduces strain and therefore improves power dissipation. The III-V material of the quantum well structure may be grown on the substrate of a wafer before the active devices (e.g., the emitter 610, the base 602 and the collector 614) are fabricated. Accordingly, the quantum well 934 is spread across all of the active devices fabricated on the wafer. The thermal sensing feature of the HBT thermal sensing device 900A may be fabricated within the quantum well 934 beneath the active devices to achieve thermal sensing beneath each of the active devices.

Thus, the aspects of the present disclosure achieve thermal sensing right beneath the heat source. For example, monitoring of the thermal sensing device yields more than the heat dissipation associated with the heat source 630 that is on the same chip level as the active devices. The heat source 630 may correspond to one or more junctions of the HBT devices 710. For example, the thermal sensing feature implemented in the quantum well 934 also monitors heat dissipation illustrated by the hot portion 930 beneath the active devices. Thus, fabricating the sensing feature of the HBT thermal sensing device 900A beneath the heat source 630 (e.g., under the sub-collector 616 or near the substrate 618), achieves thermal sensing only one to two micrometers from the heat source 630.

The HBT thermal sensing device 900A may also include a hot side electrode 928, a first cold side electrode 926 and a second cold side electrode 932. The hot side electrode 928, the first cold side electrode 926 and the second cold side electrode 932 are each in electrical contact with the well structure 934. The hot side electrode 928 may be located closer to the heat source (e.g., 630) of the HBT thermal sensing device 900A relative to the first cold side electrode 926 and/or the second cold side electrode 932. The hot side electrode 928 may be used to monitor junction temperature for controlling an HBT device bias to improve performance of an HBT-based power amplifier. In one aspect of the disclosure, the hot side electrode 928 may be a backside electrode through the substrate 618 to the well structure 934. Similarly, the first cold side electrode 926 and the second cold side electrode 932 may be provided as backside electrodes through the substrate 618 to the well structure 934. In one aspect of the disclosure, the hot side electrode 928 electrically contacts the well structure 934 and is aligned with the emitter 610.

The hot side electrode 928 may be used as a terminal for a hot spot (e.g., close to the heat source 630 and/or the hot portion 930) and the first cold side electrode 926 (close to the cold portion 922) and/or the second cold side electrode 932 (close to the cold portion 924) may be used as a terminal for a cold spot. For example, an electric potential can be detected between the hot side electrode 928 and the first cold side electrode 926 or the second cold side electrode 932. The hot side electrode 928 corresponds to a positive terminal (+) and the first cold side electrode 926 or the second cold side electrode 932 corresponds to a negative terminal (−). Because the thermal sensing feature of the HBT thermal sensing device 900A can be achieved beneath or close to each HBT device 710, the present disclosure achieves selectable monitoring of each of the HBT devices 710.

FIG. 9B illustrates another heterojunction bipolar transistor (HBT) thermal sensing device 900B for power dissipation according to aspects of the present disclosure. For illustrative purposes, some of the labelling and numbering of the devices and features of FIG. 9B are similar to those of FIGS. 6, 7, and 9A. For example, similar to the HBT device 600, the HBT thermal sensing device 900B may include an HBT active device, which includes the emitter 610, the base 602 contacting the emitter 610, and the collector 614 contacting the base 602. Similar to the HBT thermal sensing device 900A, the HBT thermal sensing device 900B also includes the sub-collector 616 contacting the collector 614.

In addition to the well structure 934, FIG. 9B also includes an isolation layer 936. In one aspect, the isolation layer 936 is provided between the HBT sub-collector 616 and the well structure 934. Because the HBT device 710 is a radio frequency device subject to high frequency operation, the isolation layer is included to avoid crosstalk and interference between the active HBT devices and the well structure 934.

Figure 10:
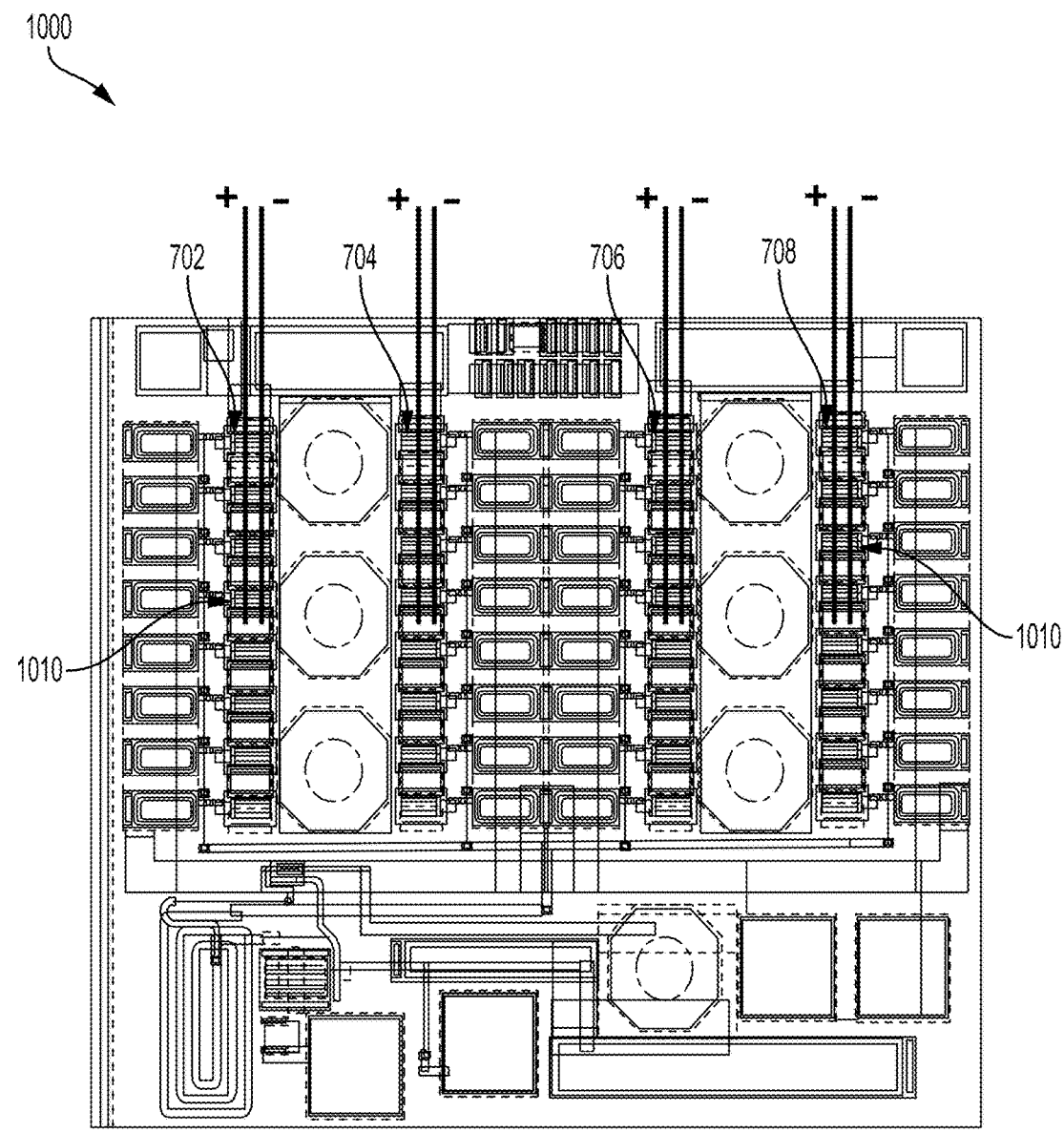
FIG. 10 illustrates a heterojunction bipolar transistor (HBT) power amplifier for mitigating power or heat dissipation according to aspects of the present disclosure.

FIG. 10 illustrates an HBT power amplifier 1000 for mitigating power or heat dissipation according to aspects of the present disclosure. For illustrative purposes, some of the labelling and numbering of the devices and features of FIG. 10 are similar to those of FIGS. 7, 9A, and 9B. For example, similar to the HBT power amplifier 700, the HBT power amplifier 1000 may include a first row 702 of HBT devices, a second row 704 of HBT devices, a third row 706 of HBT devices and a fourth row 708 of HBT devices.

The HBT power amplifier 1000, however, includes HBT thermal sensing devices 1010 (e.g., HBT thermal sensing device 900A or HBT thermal sensing device 900B) instead of the HBT devices 710 without the thermal sensing feature based on the well structure 934. The HBT power amplifier 1000 includes positive (+) and negative terminals (−) extending from detector circuitry (e.g., thermosensor) of specified HBT thermal sensing devices 1010. The positive and negative terminals of the HBT thermal sensing devices 1010 may be coupled to control signal circuitry or biasing circuitry to facilitate power or heat dissipation of the HBT power amplifier 1000.

The fabrication of the HBT thermal sensing device 1010 may include fabrication of the active HBT device and the fabrication of the thermal sensing feature (e.g., thermosensor) in the well structure 934. Among others, the fabrication of the thermal sensing feature includes fabrication of the electrodes (e.g., the hot side electrode 928, the first cold side electrode 926 and the second cold side electrode 932). The fabrication of the thermal sensing feature of the HBT thermal sensing device 900A or HBT thermal sensing device 900B may be implemented according to a front-side process where an emitter metal all the way down to a collector metal are fabricated on the well structure 934 followed by etching of the well structure to form the electrodes. Alternatively, the fabrication of the thermal sensing feature of the HBT thermal sensing device 900A or HBT thermal sensing device 900B may be implemented according to a backside process performed after fabricating the active HBT device on a front-side. This process is followed by fabrication of the thermal sensing feature using the backside process. Fabricating the thermal sensing feature may include fabricating vias to couple the thermal sensing feature to the active HBT devices.

All of the layers of the HBT thermal sensing device 900A and the HBT thermal sensing device 900B may be formed by growth (e.g., epitaxial growth). For example, a buffer layer (e.g., GaAs buffer) may be grown on a substrate to form the buffered substrate (e.g., GaAs substrate). Some implementations may not specify a buffer layer. The well structure 934 may be grown on the substrate 618 or across the wafer. For example, one hundred Angstrom of AlGaAs is grown followed by twenty Angstrom of GaAs. The process is repeated until the sufficient layers of AlGaAs/GaAs is achieved. The thermal sensing feature is formed in the well structure 934.

The thermal sensing feature may be implemented as detection circuitry to monitor for heat dissipation in the HBT thermal sensing device 1010. In some aspects of the present disclosure, the isolation layer 936 is grown on the well structure 934. The isolation layer may not be doped. For example, the isolation layer may be composed of un-doped GaAs or un-doped AlGaAs. The active HBT device including the sub-collector 616 (e.g., highly doped layer) may be grown on the isolation layer 936 or the well structure 934 when the isolation layer 936 is not included. For example, the sub-collector layer may be n-doped. Following the sub-collector 616, the collector 614, the base 602, and the emitter 610 are grown.

Figure 11:
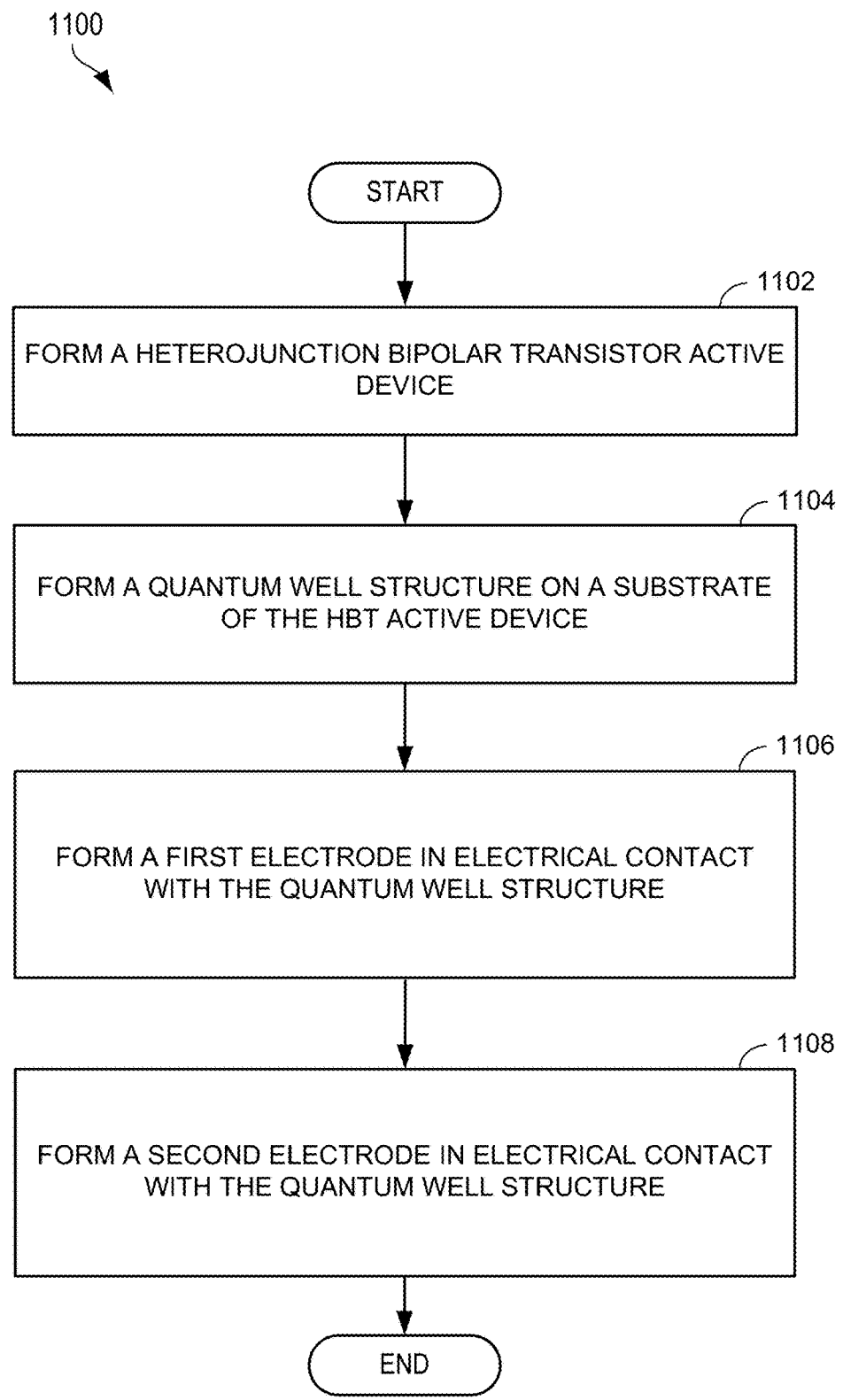
FIG. 11 is a flow diagram illustrating a method of making a heterojunction bipolar transistor (HBT) thermal sensing device, in accordance with aspects of the present disclosure.

FIG. 11 is a flow diagram 1100 illustrating a method of making a heterojunction bipolar transistor (HBT) thermal sensing device, in accordance with aspects of the present disclosure. The blocks in the flow diagram 1100 can be performed in or out of the order shown, and in some aspects, can be performed at least in part in parallel.

At block 1102, a heterojunction bipolar transistor (HBT) active device is formed. For example, the HBT active device may be a component of an HBT-based power amplifier, such as the HBT power amplifier 1000 shown in FIG. 10. As shown in FIGS. 9A-9B, the HBT active device may include an emitter 610, a base 602 contacting the emitter 610, a collector 614 contacting the base 602, and a sub-collector 616 contacting the collector 614. The emitter 610 includes an emitter contact 624, the base includes base contacts 604, and the collector includes collector contacts 620. The sub-collector 616 may be supported by a compound semiconductor substrate 618. According to aspects, the HBT active device may be formed according to a front end of line (FEOL) process.

At block 1104, a quantum well structure is formed on a substrate of the HBT active device. For example, as shown in FIGS. 9A and 9B, the well structure 934 may be formed as a layer/layers between the HBT active device and/or the sub-collector 616 and the substrate 618.

At block 1106, a first electrode (e.g., hot side electrode) in electrical contact with the quantum well structure is formed. For example, as shown in FIGS. 9A-9B, the HBT thermal sensing device 900A or 900B includes a hot side electrode 928. The hot side electrode 928 is in electrical contact with the well structure 934.

At block 1108, a second electrode (e.g., cold side electrode) in electrical contact with the quantum well structure is formed. For example, as shown in FIGS. 9A-9B, the HBT thermal sensing device 900A or 900B includes a first cold side electrode 926 and a second cold side electrode 932. The first cold side electrode 926 and the second cold side electrode 932 are each in electrical contact with the well structure 934.

According to a further aspect of the present disclosure, a heterojunction bipolar transistor (HBT) thermal sensing device is described. The HBT thermal sensing device may include first means for electrically contacting the quantum well structure. The first means may, for example, include a hot side electrode 928, as shown in FIGS. 9A and 9B. The HBT thermal sensing device may also include second means for electrically contacting the quantum well structure. The second means may, for example, include a cold side electrode 926 and/or a cold side electrode 932, as shown in FIGS. 9A and 9B. In another aspect, the aforementioned means may be any electrode configured to perform the functions recited by the aforementioned means.

Figure 12:
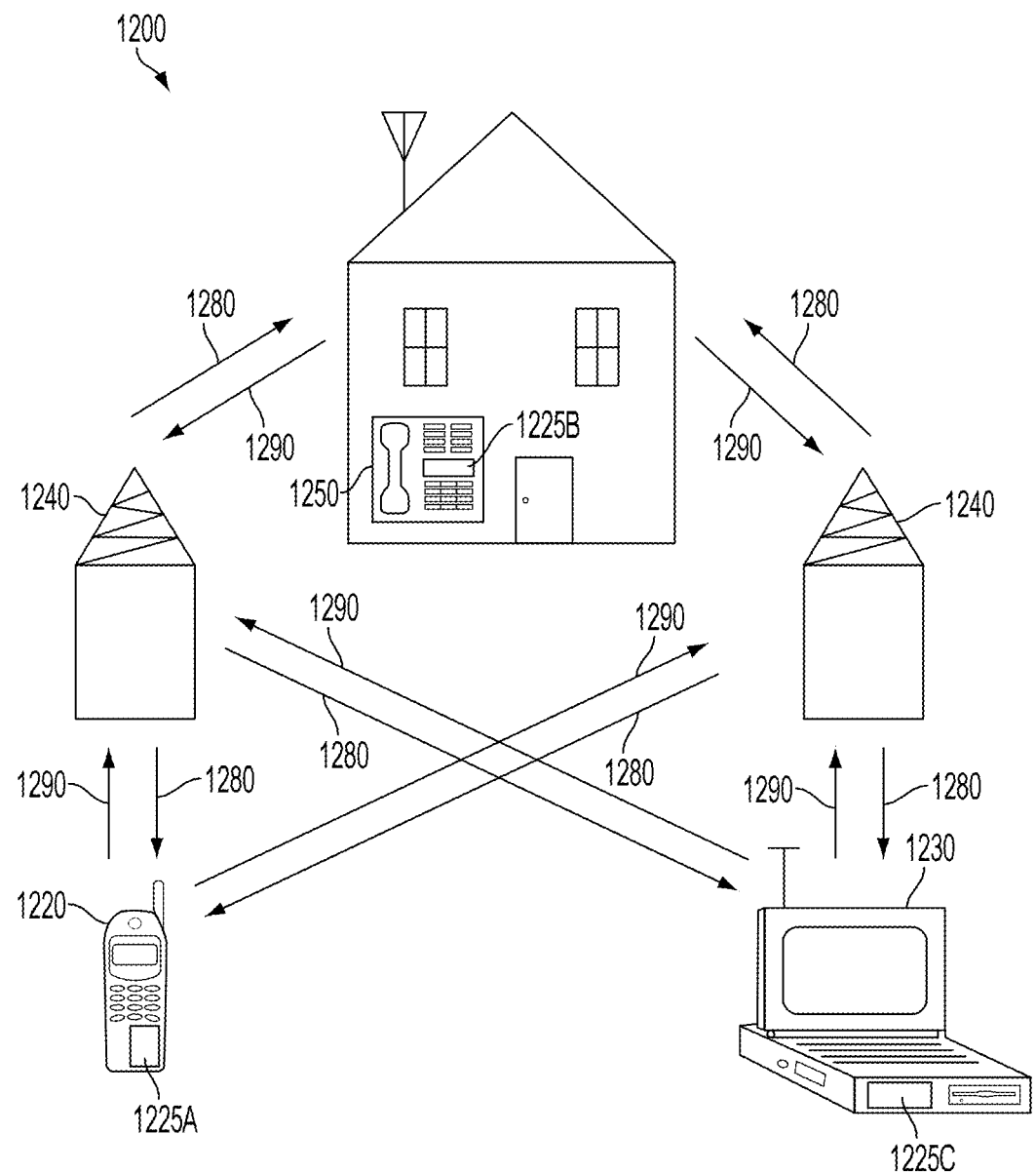
FIG. 12 is a block diagram showing an exemplary wireless communication system in which an aspect of the disclosure may be advantageously employed.

FIG. 12 is a block diagram showing an exemplary wireless communication system 1200 in which an aspect of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include IC devices 1225A, 1225C, and 1225B that include the disclosed HBT thermal sensing device. It will be recognized that other devices may also include the disclosed HBT thermal sensing device, such as the base stations, user equipment, and network equipment. FIG. 12 shows forward link signals 1280 from the base station 1240 to the remote units 1220, 1230, and 1250 and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the disclosed HBT thermal sensing device.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A heterojunction bipolar transistor (HBT) thermal sensing device, comprising:
   a sub-collector contacting an emitter, a collector, and a base of an HBT active device;
   an HBT substrate;
   a quantum well structure between the HBT active device and the HBT substrate, the quantum well structure between the sub-collector and the HBT substrate;
   a first side electrode in electrical contact with the quantum well structure; and
   a second side electrode in electrical contact with the quantum well structure.

2. The HBT thermal sensing device of claim 1, in which the first side electrode comprises a backside electrode through the HBT substrate and in electrical contact with the quantum well structure.

3. The HBT thermal sensing device of claim 1, in which the quantum well structure comprises a quantum well.

4. The HBT thermal sensing device of claim 1, in which the quantum well structure comprises a superlattice structure.

5. The HBT thermal sensing device of claim 4, in which a material of the superlattice structure is matched with a material of the HBT substrate.

6. The HBT thermal sensing device of claim 1, further comprising an isolation layer between the sub-collector and the quantum well structure.

7. The HBT thermal sensing device of claim 1, in which the first side electrode comprises a hot side electrode closer to a heat source of the HBT thermal sensing device relative to the second side electrode.

8. The HBT thermal sensing device of claim 1, in which the second side electrode comprises a cold side electrode further from a heat source of the HBT thermal sensing device relative to the first side electrode.

9. A method of making a heterojunction bipolar transistor (HBT) thermal sensing device, comprising:
   forming an HBT active device;
   forming a sub-collector contacting an emitter, a collector, and a base of the HBT active device;
   forming a quantum well structure on a substrate of the HBT active device, the quantum well structure between the sub-collector and the substrate;
   forming a first electrode in electrical contact with the quantum well structure; and
   forming a second electrode in electrical contact with the quantum well structure.

10. The method of claim 9, in which forming the quantum well structure comprises:
    growing alternating layers of large bandgap compound semiconductor material and small bandgap compound semiconductor material on the substrate; and
    depositing an isolation layer on the alternating layers of large bandgap compound semiconductor material and small bandgap compound semiconductor material.

11. The method of claim 9, in which forming the quantum well structure comprises epitaxially growing the quantum well structure.

12. The method of claim 9, in which forming the first electrode comprises forming a hot side electrode closer to a heat source of the HBT thermal sensing device relative to the second electrode.

13. The method of claim 9, in which forming the second electrode comprises forming a cold side electrode further from a heat source of the HBT thermal sensing device relative to the first electrode.

14. A heterojunction bipolar transistor (HBT) thermal sensing device, comprising:
- a sub-collector contacting an emitter, a collector, and a base of an HBT active device;
- an HBT substrate;
- a quantum well structure between the HBT active device and the HBT substrate, the quantum well structure between the sub-collector and the HBT substrate;
- first means for electrically contacting the quantum well structure; and
- second means for electrically contacting the quantum well structure.

15. The HBT thermal sensing device of claim 14, in which the quantum well structure comprises a quantum well.

16. The HBT thermal sensing device of claim 14, in which the quantum well structure comprises a superlattice structure.

17. The HBT thermal sensing device of claim 16, in which a material of the superlattice structure is matched with a material of the HBT substrate.

18. The HBT thermal sensing device of claim 14, further comprising an isolation layer between the sub-collector and the quantum well structure.

* * * * *